United States Patent [19]

Jones et al.

[11] 4,289,480

[45] Sep. 15, 1981

[54] PROCESS FOR HEATING THIN SURFACE LAYERS

[75] Inventors: C. Bradford Jones; Richard D. Kinard, both of Wilmington, Del.

[73] Assignee: E. I. Du Pont de Nemours and Company, Wilmington, Del.

[21] Appl. No.: 90,679

[22] Filed: Nov. 2, 1979

[51] Int. Cl.³ .............................................. F27B 9/28
[52] U.S. Cl. ...................................................... 432/8
[58] Field of Search ....................... 432/8, 59; 427/96

[56] References Cited

U.S. PATENT DOCUMENTS

| | | | |
|---|---|---|---|
| 2,352,444 | 6/1944 | Miller | 432/8 |
| 2,910,351 | 10/1959 | Szpak et al. | 41/43 |
| 2,919,179 | 12/1959 | Van Wagner | 41/43 |
| 3,106,479 | 10/1963 | Evans | 117/17.5 |
| 3,591,276 | 7/1971 | Byrne | 355/3 |
| 3,865,540 | 2/1975 | Loeffler | 432/8 |

Primary Examiner—John J. Camby

[57] ABSTRACT

In the lamination of thermoplastic polymer layers to substrates a thin surface layer of the substrate can be heated to improve adhesion without substantially heating the mass of the substrate by advancing the exposed surface of the thin layer in surface-conforming contact with a heated surface for 0.1 to one second at an interface pressure of 0.1 to 5 kilograms per centimeter of substrate width, the heated surface having an initial temperature of 35°–350° C.

14 Claims, 2 Drawing Figures

PROCESS FOR HEATING THIN SURFACE LAYERS

TECHNICAL FIELD

The invention relates to the heating of thin layers upon dielectric substrates. The invention relates particularly to heating the surface substrates for printed circuit boards immediately before applying thermoplastic resist materials thereto.

BACKGROUND ART

In the art of applying resist material to a printed circuit board, wherein the resist material is in a solid form, it is frequently desirable to preheat either the resist or the circuit board so as to aid the resist material in adhering to the copper surface of the circuit board. For example, in the lamination of dry-film photoresist to printed circuit boards, it is desirable to heat the photosensitive layer to a temperature approaching its softening point in order to obtain better adhesion to the electroconductive surface of the printed circuit board. Heating of circuit boards is particularly important for magnetic printing processes such as that disclosed in U.S. Patent Application Ser. No. 015,799 filed Mar. 2, 1979 (DE-0204A) now abandoned, wherein an image of coalescible magnetic toner particles is brought into contact with a preheated circuit board under pressure to cause the resist image to transfer to the circuit board. The resultant imaged circuit board is then subjected to the usual additive or subtractive processes to form the desired circuit pattern.

Heating of circuit boards has been done in many ways. For example, in ovens, between hot rolls, under heat lamps and by induction heating. While each of these can be useful in certain applications and under particular conditions, each also has substantial disadvantages.

When circuit boards are heated in ovens, of course the entire mass of the board is heated, that is, not only the electroconductive surface, but also the board mass. With such bulk heating of the board, the board expands, often anisotropically, and causes problems of registration of the resist material on the circuit board. In addition, such bulk heating can cause distortion and warping of certain circuit boards.

The process referred to in the above-referred U.S. Patent Application Ser. No. 015,799 discloses such an oven which is comprised of spaced in-line hot plates just upstream from the resist application step. The circuit board, copper layer side down, is rested on the lower hot plate, while the upper heat plate heats the dielectric support side of the circuit board. When the entire board is preheated, it is then forwarded to the resist application step.

It has now been found that much board distortion and warping can be avoided by merely "skin heating" the board, that is, heating the metallic surface of the board to a suitably high temperature without substantially heating the board mass. One way of doing this, which has been suggested, is radiant heat using heat lamps or other sources of radiant heat. This approach has proved to be rather inefficient and, because of the increasingly high cost of energy, uneconomical. The inefficiency of radiant heating is in large part due to reflection of the radiant heat off the electroconductive surface. This results in the surfaces being heated up relatively slowly with the result that, by the time the surface obtains the desired temperature, the metal layer is transferring substantial heat to the dielectric support. This disadvantage is particularly acute in the case of copper surfaces which constitute the majority of electroconductive surfaces used for printed circuit boards. Infrared heating cannot achieve suitably low energy consumption for skin preheating unless the surface of the conductive layer is blackened. This has the disadvantage, however, of requiring an extra manufacturing step and of requiring eventual removal of the black coloration as well.

Another way of skin heating, which has been proposed, is the use of heated rubber-coated rolls. The use of heated aluminum rolls was unsatisfactory in that the smaller nip area resulted in even less efficient heating of the board.

A still further skin heating method has been tried, namely induction heating. Induction heating raises the surface temperature of the circuit board by exposing it to a rapidly alternating electro magnetic field. The copper or other metal is heated as the metal molecules vibrate rapidly in response to the alternating magnetic field. Despite the potentially efficient heating and simple preheater design of the inductive heater, the power supply required to heat circuit boards with adequate efficiency requires excessive capital investment.

The use of hot air jets impacting on the board surface has also been explored but this requires the handling of large quantities of air and is therefore uneconomical. It would appear that resistance heating by passing a current through the surface board, at least in the case of electroconductive metal surfaces, would be effective to heat the layer for lamination. However, this was found to be impracticable because of the concentration of heat around reduced cross-sectional areas.

Thus, while skin heating would eliminate substantial board distortion, it has heretofore been extremely difficult to carry out in an energy efficient and economically reasonable manner.

BRIEF DESCRIPTION OF THE INVENTION

The disadvantages of the prior art are overcome by the process of the invention in which the thin surface layer of a thicker dielectric substrate is heated without substantially heating the substrate mass by advancing the exposed surface of the thin layer in surface-conforming contact with a continuously heated surface for 0.1 to one second at an interface pressure of from 0.1 to 5 kilograms per centimeter, the heated surface having an initial temperature of 35°–260° C.

DETAILED DESCRIPTION AND BEST MODE

Figure 1:
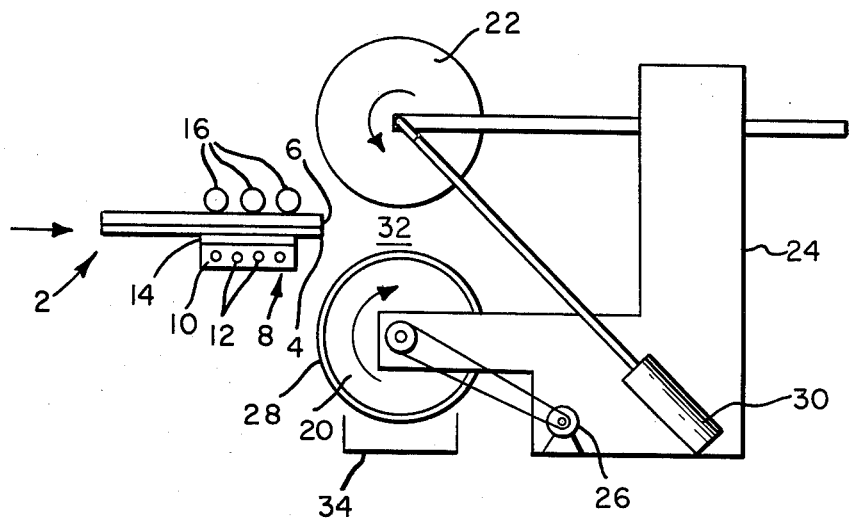
FIG. 1 shows in side elevation an embodiment for preheating a circuit board in accordance with the method of the present invention using a stationary planar heating surface.

In FIG. 1 is shown a circuit board 2 consisting of an electrically conductive layer 4, usually of copper, adhered to one side of a dielectric support 6, usually of glass or mineral fiber reinforced epoxy or phenolic resin. This is a conventional circuit board, with the thickness of the copper layer being about 0.0127 to 0.0508 mm and the thickness of the dielectric support being such as to provide the strength and rigidity desired for the printed circuit ultimately obtained from the board.

The board is gripped manually or mechanically and moved along a path to the resist application step described later herein.

A stationary hot plate 8 serves as the heated surface and is positioned to contact the conductive layer 4 of the board 2 as it continuously moves along the aforesaid path. The hot plate consists of a copper body 10 having heating rods 12 positioned thereon and a thin planar wear resistant face 14 such as of stainless steel. A series of pressure rolls 16 is provided to maintain an interface pressure of at least 0.1 kg/cm of substrate width during passage of the latter thereover. An interface pressure across the substrate of at least about 0.5 kg/cm is preferred in order to assure surface-conforming contact. It is also preferred that the interface pressure not exceed about 5 kg/cm and still more preferably about 2 kg/cm.

Contact of the conductive layer 4 with the stationary hot plate 8 heats the conductive layer quickly and efficiently. The heating is substantially confined to the thin outer "skin" of the circuit board because of the short duration of heating, i.e., the rate of passage of the board and the length of hot plate traversed by the board is such that the heating time for any area of the board is no greater than about one second and preferably no greater than about 0.7 second. However the heating time in contact with the heated surface should be at least 0.1 and preferably 0.2 second. Surprisingly, this short duration of heating can be sufficient to bring the skin of the board to the temperature desired for resist application. The bulk of the dielectric support is substantially unheated by this short duration of heating. Consequently, board expansion or distortion is virtually eliminated.

The hot plate 8 is generally heated to a temperature which is higher than the temperature reached by the outer layer 4. Thus, the outer layer is being heated up during its entire contact with the hot plate.

The surface temperature required for the heating source is a function of at least three variables: (1) physical characteristics, especially softening temperature of the material to be laminated; (2) time of surface conforming contact which, in turn, is a function of board speed; and (3) physical characteristics of the substrate and its thin layer. Within the context of using the process of the invention for preheating substrates prior to laminating thermoplastic polymers thereon, initial heating surface temperatures of from about 35° to about 350° C. and preferably from about 65° to about 200° C. are used. A temperature of at least about 150° C. is still further preferred. Because of the very short heating times involved, it is possible, in many instances, to use heating surface temperatures substantially above the melting point of the laminating polymer without incurring thermal degradation. It will, of course, be recognized by those skilled in the art that upon mating the surfaces of the thin layer and the heat sources even for the short times involved here, the heater surface temperature will fall as heat is transferred therefrom to the thin layer. The above-described temperature range therefore refers to the "initial" temperature of the heating surface at the instant the surfaces are brought together, not the lower temperatures which result after transfer of heat to the thin layer has taken place.

To describe the resist application step in greater detail, rolls 20 and 22 are provided, each rotatably mounted in a frame 24. Roll 20 is the printing roll and it is driven by variable speed motor 26. The printing roll is surfaced with a magnetic film 28 of a layer of permanent magnetic material such as $CrO_2$ particles in a binder matrix coated on a support film such as oriented polyethylene terephthalate.

Roll 22 is the pressure roll. Its axis of rotation is variable by virtue of a piston device 30 which controls the pressure exerted by roll 22 at the nip 32 between rolls 20 and 22.

The desired circuit design is imaged by conventional means in the magnetic film, and as roll 20 rotates, the magnetic image attracts coalescible magnetic toner particles applied to the film 28 from toner applicator 34. The applicator can be a type which forms a fluidized bed of toner particles impinging against the film 28. The film 28 can be treated with a corona discharge and/or an air knife to remove toner particles from nonimage areas of the film.

As the roll 20 continues rotation, the image of toner particles on film 28 enters nip 32 along with the preheated board 2 (skin heated only). The combination of pressure supplied by rolls 20 and 22 and heat supplied by the outer layer 4 causes the image of toner particles to transfer to the outer layer. This image can be the resist image if the particles are sufficiently coalesced to be liquid impervious or the image can be subsequently heated to coalesce the particles to this required degree.

The toner particles comprise a coalescible resin binder component and magnetic particles embedded therein. Preferred compositions are disclosed in Ser. No. 015,799.

The temperature of preheating which is needed depends on the temperature characteristics of the toner particles. Generally, the temperature of the outer layer will be from about 70° to 150° C. and usually from 80° to 110° C. The conductive layer 4 loses some of its temperature during passage from the hot plate 8 to the nip 32, but this is minimized by close spacing of the hot plate to the nip and high speed of passage of the board, e.g., 2.54 to 76.2 cm/sec., across the hot plate 8 and through the nip. Typically, the time of passage of a heated area of conductive layer 4 from the hot plate 8 to the nip will be less than two seconds.

By way of example, the process can be conducted as follows:

A circuit board blank is gripped at one edge and advanced at the rate of 30 cm/sec through a preheat zone and a print nip. In the preheat zone, one side of the board is heated by passing it in face contact over a hot metal platen. The platen is 14 cm long in the direction of travel, so that each segment of the board is in contact with it for 0.46 seconds. The platen surface is maintained at a constant temperature of 166° C. by internal heaters. A series of spring loaded backup rollers bear down on the unheated side of the board, applying a pressure of about 0.5 kg/cm, so that intimate contact of the circuit board with the hot platen is maintained as the board passes through.

The print nip consists of a printing drum, on which is mounted a magnetic printing master that has been decorated with toner, and a backup drum. The drums are arranged so that their surface rotation speeds are equivalent to the linear speed of the board, and the print drum rotates in contact with the board's heated surface, while the backup drum rotates in contact with the unheated surface directly opposite the print drum. The backup drum's only function is to maintain pressure between the print drum and the board. Air cylinders on a floating axle apply a pressure of 9 kg/cm to the board and the print nip.

Using the above equipment and process settings, a circuit image of iron oxide toner was completely transferred and coalesced onto the circuit panel. Composition of the toner was 50% wt. magnetic iron oxide, 45% wt. binder (Atlac 382ES, trade name for resin purchased from ICI Americas, Ltd., Wilmington, Del., a propoxylated bisphenol-A, fumaric acid polyester having a tack point of 70° C. and a liquid point of 100° C.) and 5% wt. triphenyl phosphate plasticizer. The board's bulk temperature after printing was only about 45° C. In experiments with equipment that bulk heated the board in an oven or under a hot platen prior to printing at 30 cm/sec and 9 kg/cm, the board bulk temperature was measured to be fully 20° C. higher. Since the two preheat and printing operations were conducted at the same speed and pressure, it is evident that the process of the invention achieved skin heating without substantially heating the board mass.

Figure 2:
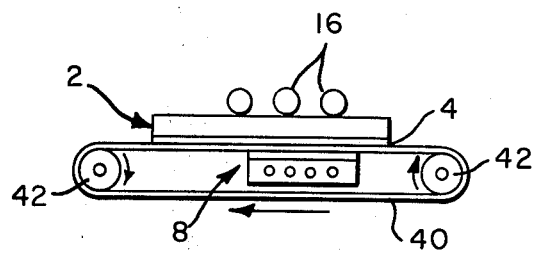
FIG. 2 shows in side elevation another embodiment for carrying out the process of the present invention, using a moving planar heating surface.

While it is surprising that the stationary hot plate adequately skin heats the outer layer so as to provide board preheat board for resist application, it is also possible to introduce a heat conductive belt between the hot plate and the board as shown in FIG. 2. More specifically, a heat conductive belt 40 such as of stainless steel foil is turned about a pair of rolls 42, one of which is driven, to move the belt in the same direction and at the same speed as the board 2. The belt is heated by its contact with hot plate 8 which is located in the region of the surface-conforming contact and in turn, the heated belt skin heats the outer layer 4 of the board. Interface pressure between the belt 40 and the thin layer 4 is maintained by pressure rolls 16. This arrangement can be used in place of the hot plate arrangement of FIG. 1 except that the hot plate cannot be positioned as close to the nip as in the FIG. 1 arrangement.

We claim:

1. A process for heating a thin surface layer of a thicker dielectric substrate without substantially heating the substrate mass which comprises advancing the exposed surface of the thin layer in surface-conforming contact with a continuously heated surface for 0.1 to one second at an interface pressure of 0.1 to 5 kilograms per centimeter of substrate width, the heated surface having an initial temperature of 35°-350° C.

2. The process of claim 1 in which the thin layer is an electroconductive metal layer bearing upon the substrate.

3. The process of claim 2 in which the dielectric substrate is a circuit board.

4. The process of claim 2 in which the metal layer is copper.

5. The process of claim 1 in which the substrate is planar.

6. The process of claim 1 in which the transfer of heat is effected from a stationary heated platen.

7. The process of claim 1 in which the continuously heated surface is a heat-conductive belt moving with the substrate, the belt being heated by transfer of heat from a heat source which is located in the region of the surface-conforming contact.

8. The process of claim 7 in which the heat source is stationary.

9. The process of claim 1 in which the exposed surface of the thin layer is contacted with a heated surface having an initial temperature of at least about 150° C. for 0.2 to 0.7 second at an interface pressure of at least about 0.5 kilograms centimeter.

10. In a process for the transfer of an image of coalescible magnetic toner particles to a preheated circuit board, the improvement comprising utilizing the process of claim 1 to preheat the circuit board.

11. The process of claim 10 in which the toner particles are comprised of a resin binder having magnetic particles embedded therein.

12. The process of claim 11 in which the toner is comprised of magnetic iron oxide embedded in a binder of plasticized resin.

13. The process of claim 12 in which the binder is comprised of a fumaric acid polyester of propoxylated bisphenol-A, having a tack point of 70° C. and a liquid point of 100° C., and plasticized with triphenyl phosphate.

14. In a process for applying a dry film photoresist to a preheated printed circuit board, the improvement comprising utilizing the process of claim 1 to preheat the board.

* * * * *